(12) United States Patent
Sandhu et al.

(10) Patent No.: US 7,094,690 B1
(45) Date of Patent: Aug. 22, 2006

(54) DEPOSITION METHODS AND APPARATUSES PROVIDING SURFACE ACTIVATION

(75) Inventors: Gurtej S. Sandhu, Boise, ID (US); Garo J. Derderian, Boise, ID (US); Guy T. Blalock, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 297 days.

(21) Appl. No.: 09/652,533

(22) Filed: Aug. 31, 2000

(51) Int. Cl.
*H01L 21/00* (2006.01)

(52) U.S. Cl. ........................................ 438/654; 438/681
(58) Field of Classification Search ................ 438/628, 438/644, 654, 681, 37, 478, 61, 471, 477
See application file for complete search history.

(56) References Cited

U.S. PATENT DOCUMENTS

| | | | |
|---|---|---|---|
| 3,785,853 A | 1/1974 | Kirkman et al. | |
| 4,369,105 A | 1/1983 | Caldwell et al. | 204/290 F |
| 4,789,648 A | 12/1988 | Chow et al. | |
| 4,831,003 A | 5/1989 | Lang et al. | 502/182 |
| 4,913,090 A | 4/1990 | Harada et al. | |
| 5,116,640 A | 5/1992 | Mikami et al. | |
| 5,273,930 A | 12/1993 | Steele et al. | |
| 5,281,274 A | 1/1994 | Yoder | |
| 5,366,555 A | 11/1994 | Kelly | |
| 5,366,953 A | 11/1994 | Char et al. | |
| 5,413,671 A | 5/1995 | Ketchum | |
| 5,462,603 A | 10/1995 | Murakami | |
| 5,480,818 A | 1/1996 | Matsumoto et al. | 437/40 |
| 5,597,609 A | 1/1997 | Beisswenger et al. | |
| 5,597,756 A | 1/1997 | Fazan et al. | |
| 5,616,208 A | 4/1997 | Lee | |
| 5,747,113 A | 5/1998 | Tsai | |

(Continued)

FOREIGN PATENT DOCUMENTS

JP 05251339 9/1993

OTHER PUBLICATIONS

Suntola, "Surface chemistry of materials deposition at atomic layer level", Applied Surface Science, vol. 100/101, Mar. 1996, pp. 391–398.*

(Continued)

*Primary Examiner*—W. David Coleman
(74) *Attorney, Agent, or Firm*—Wells St. John P.S.

(57) ABSTRACT

A deposition method includes, at a first temperature, contacting a substrate with a surface activation agent and adsorbing a first layer over the substrate. At a second temperature greater than the first temperature, the first layer may be contacted with a first precursor, chemisorbing a second layer at least one monolayer thick over the substrate. The first layer may enhance a chemisorption rate of the first precursor compared to the substrate without the surface activation agent adsorbed thereon. One deposition apparatus includes a deposition chamber with a precursor gas dispenser in a contacting zone and a cooling gas dispenser in a cooling zone. A substrate chuck moves by linear translational motion from the contacting zone to the cooling zone. The substrate chuck includes a substrate lift that positions a deposition substrate at an elevation above a heated surface of the substrate chuck when dispensing a cooling gas or surface activation agent. Another deposition apparatus includes a cooling chamber with a cooled substrate chuck and a contacting chamber with a heated substrate chuck. The contacting chamber also has a precursor gas dispenser and the heated substrate chuck includes a substrate lift. A robotic substrate handler moves a substrate from the cooled substrate chuck to the heated substrate chuck.

21 Claims, 3 Drawing Sheets

U.S. PATENT DOCUMENTS

| | | | |
|---|---|---|---|
| 5,879,459 A * | 3/1999 | Gadgil et al. | 118/715 |
| 5,916,365 A * | 6/1999 | Sherman | 117/92 |
| 5,929,526 A | 7/1999 | Srinivasan et al. | |
| 5,985,770 A | 11/1999 | Sandhu et al. | |
| 5,997,588 A | 12/1999 | Goodwin et al. | |
| 6,066,358 A | 5/2000 | Guo | |
| 6,083,832 A | 7/2000 | Sugai | 438/672 |
| 6,114,099 A | 9/2000 | Liu et al. | |
| 6,139,695 A | 10/2000 | Washburn et al. | |
| 6,143,659 A | 11/2000 | Leem | |
| 6,174,377 B1 * | 1/2001 | Doering et al. | 118/715 |
| 6,203,613 B1 | 3/2001 | Gates et al. | 117/104 |
| 6,203,619 B1 | 3/2001 | McMillan | |
| 6,235,571 B1 | 5/2001 | Doan | |
| 6,270,572 B1 | 8/2001 | Kim et al. | 117/93 |
| 6,287,965 B1 | 9/2001 | Kang et al. | 438/648 |
| 6,290,824 B1 | 9/2001 | Ishikawa et al. | |
| 6,306,216 B1 | 10/2001 | Kim et al. | |
| 6,307,184 B1 | 10/2001 | Womack et al. | |
| 6,335,561 B1 | 1/2002 | Imoto | |
| 6,338,874 B1 | 1/2002 | Law et al. | |
| 6,355,561 B1 * | 3/2002 | Sandhu et al. | 438/676 |
| 6,358,377 B1 | 3/2002 | Schloremberg et al. | |
| 6,368,954 B1 | 4/2002 | Lopatin et al. | |
| 6,399,921 B1 | 6/2002 | Johnsgard et al. | |
| 6,420,230 B1 * | 7/2002 | Derderian et al. | 438/255 |
| 6,447,908 B1 | 9/2002 | Yun et al. | |
| 6,458,416 B1 * | 10/2002 | Derderian et al. | 427/301 |
| 6,479,902 B1 | 11/2002 | Lopatin et al. | |
| 6,596,636 B1 * | 7/2003 | Sandhu et al. | 438/676 |
| 6,630,201 B1 | 10/2003 | Chiang et al. | |
| 2002/0125516 A1 | 9/2002 | Marsh et al. | |

OTHER PUBLICATIONS

Aarik et al., "Effect of growth conditions on formation of $TiO_2$–II thin films in atomic layer deposition process", Journal of Crystal Growth, vol. 181, Aug. 1997, pp. 259–264.*

Skarp, "ALE–reactor for large area depositions", Applied Surface Science, vol. 112, Mar. 1997, pp. 251–254.*

U.S. patent application Ser. No. 09/716,288, Sandhu, filed Nov. 21, 2000.

U.S. patent application Ser. No. 09/927,230, Doan, filed Aug. 2001.

U.S. patent application Ser. No. 09/643,004, Mercaldi, filed Sept. 26, 2002, Mar. 20, 2003.

U.S. patent application Ser. No. 09/619,449, Derderian, filed Jan. 8, 2002.

J. Aarik, et al, Control of Thin Film Structure by Reactant Pressure in Atomic Layer Deposition of $TiO_2$, Journal of Crystal Growth vol. 169, (1996), pp. 496–502.

* cited by examiner

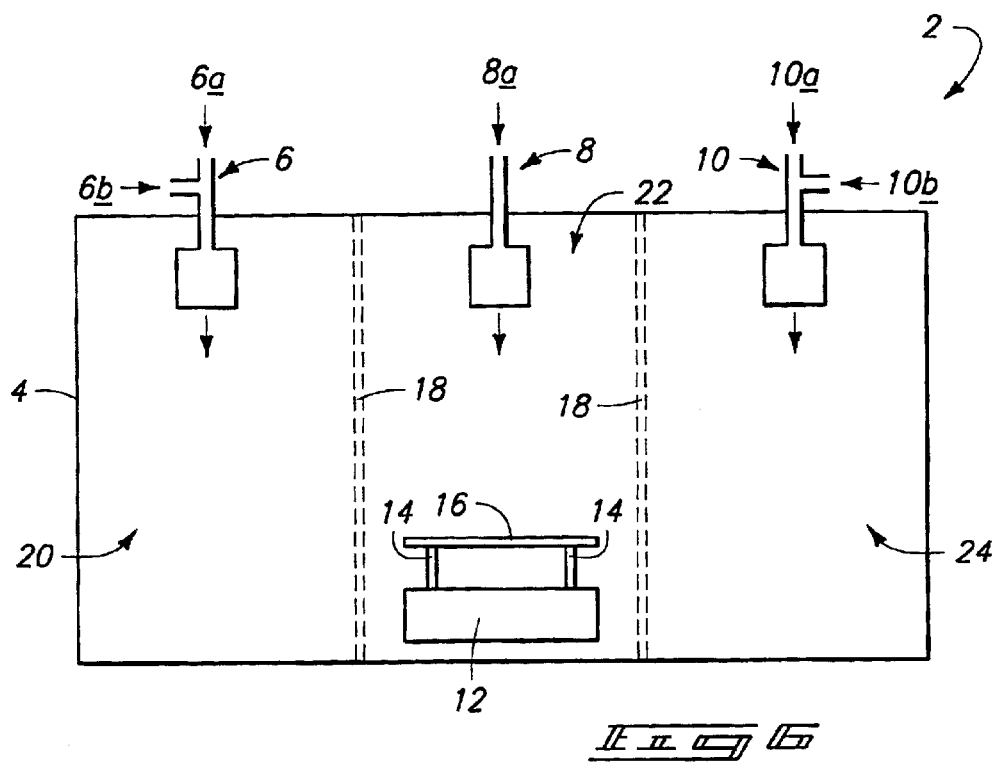
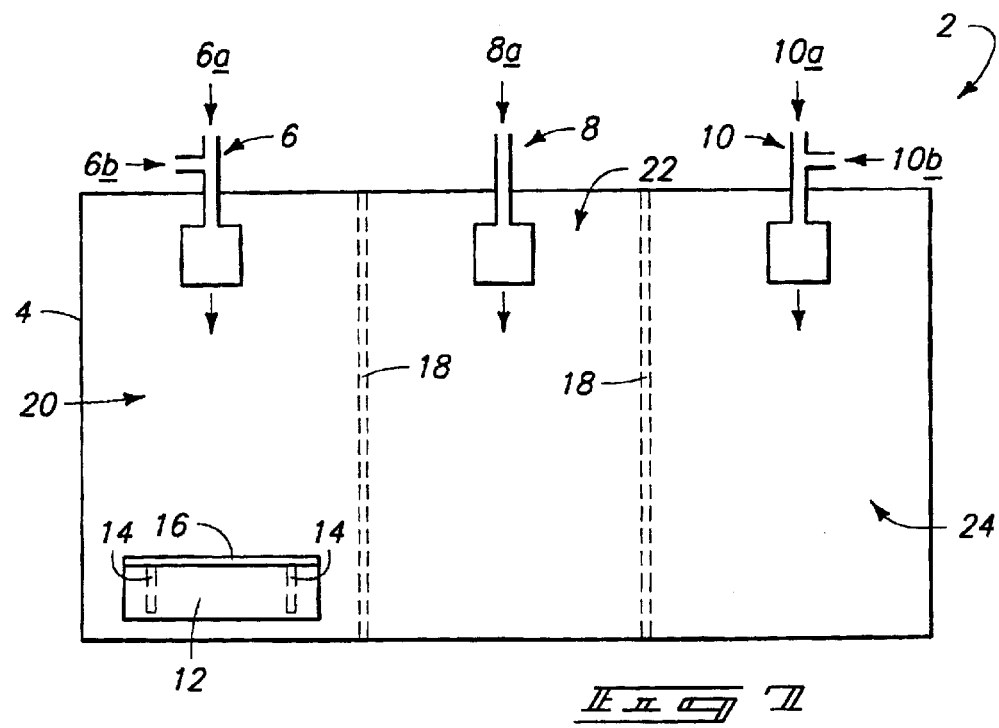

DEPOSITION METHODS AND APPARATUSES PROVIDING SURFACE ACTIVATION

TECHNICAL FIELD

This invention relates to deposition methods including surface activation of a substrate and deposition apparatuses providing surface activation of a substrate.

BACKGROUND OF THE INVENTION

Atomic layer deposition (ALD) is recognized as a deposition technique that forms high quality materials with minimal defects and tight statistical process control. Even so, it is equally recognized that ALD can have limited application. In some circumstances, the theoretically expected quality of an ALD layer is not achieved.

It can be seen that a need exists for an ALD method that forms a layer without introducing intolerable defects into the material.

SUMMARY OF THE INVENTION

According to one aspect of the invention, a deposition method includes, at a first temperature, contacting a substrate with a surface activation agent and adsorbing a first layer over the substrate. At a second temperature greater than the first temperature, the first layer may be contacted with a first precursor and a second layer may be chemisorbed at least one monolayer thick over the substrate. As an example, the first layer may enhance a chemisorption rate of the first precursor compared to the substrate without the surface activation agent adsorbed thereon. Also, the first temperature may be less than a chemisorption temperature of the surface activation agent on the substrate. The first and second temperatures may be those of at least a portion of the substrate, those of an outermost surface of the substrate, or, respectively, those of the surface activation agent and first precursor. The second layer may be chemisorbed on the first layer, or the method may include substantially displacing the first layer from over the substrate during chemisorption of the first layer on the substrate.

In another aspect of the invention, a deposition method includes, at an initial temperature less than a chemisorption temperature of a surface activation agent, adsorbing the agent over a substrate. At a deposition temperature greater than the initial temperature, a first species may be atomic layer deposited over the substrate. As an example, the surface activation agent may enhance an atomic layer deposition rate of the first species compared to the substrate without the surface activation agent adsorbed thereon. The method may further include atomic layer depositing a second species on the atomic layer deposited first species, the deposited first and second species combined comprising a deposition material.

In a further aspect of the invention, a deposition method includes adsorbing a surface activation agent over a substrate, at least an outer surface of the substrate being at a first temperature less than a chemisorption temperature of the agent. A temperature of at least a portion of the substrate may then be altered. A monolayer of a first compound may be chemisorbed over the substrate, at least an outer surface of the substrate being at a second temperature greater than the first temperature. The agent may be substantially displaced from over the substrate and a monolayer of a second compound may be chemisorbed on the first compound monolayer.

A still further aspect of the invention includes a deposition method of contacting a bulk semiconductor wafer with a cooling medium to establish at least an outer surface of the wafer at an initial temperature. The wafer may be contacted with a surface activation agent, adsorbing a first layer on the wafer. The initial temperature may be less than a chemisorption temperature of the agent. The wafer may be placed on a heated wafer chuck, establishing at least an outer surface of the wafer at a deposition temperature greater than the initial temperature. The first layer may be contacted with a deposition precursor, chemisorbing a second layer at least one monolayer thick over the wafer. Examples of contacting with a cooling medium include elevating the wafer over the heated wafer chuck and contacting the wafer with cooling gases as well as placing the wafer on a cooled wafer chuck different from the heated wafer chuck.

Other aspects of the invention include deposition apparatuses. One such apparatus includes a deposition chamber having at least one precursor gas dispenser in each of at least one contacting zone and at least one cooling gas dispenser in each of at least one cooling zone. A substrate chuck moves by linear translational motion from the at least one contacting zone to the at least one cooling zone. The substrate chuck includes a substrate lift that positions a deposition substrate at an elevation above the heated surface of the substrate chuck when dispensing a cooling gas in the at least one cooling zone and when dispensing a surface activation agent in the at least one contacting zone. An exemplary deposition chamber has two contacting zones and one cooling zone. The substrate chuck moves from one contacting zone through the cooling zone to another contacting zone. Contacting and cooling zones may be established with at least one of an inert gas curtain or suitable gas flow conditions. Also, the substrate lift may comprise positioning pins of a substrate chuck.

Another deposition apparatus includes at least one cooling chamber having a cooled substrate chuck and at least one contacting chamber having a heated substrate chuck. The contacting chamber may also have at least one precursor gas dispenser. The heated substrate chuck may include a substrate lift that positions a deposition substrate at an elevation above a heated surface of the heated substrate chuck when dispensing a surface activation agent in the contacting chamber. A robotic substrate handler may move a substrate from the at least one cooled substrate chuck to the at least one heated substrate chuck.

BRIEF DESCRIPTION OF THE DRAWINGS

Preferred embodiments of the invention are described below with reference to the following accompanying drawings.

FIG. 6 shows a diagrammatic view of a deposition apparatus according to one aspect of the invention at a processing step according to another aspect of the present invention.

FIG. 7 shows the deposition apparatus of FIG. 6 at a processing step subsequent to that shown in FIG. 6.

FIG. 8 shows a diagrammatic view of an alternative deposition apparatus according to a further aspect of the invention at a processing step according to yet another aspect of the present invention.

DETAILED DESCRIPTION OF THE PREFERRED EMBODIMENTS

Figure 1:
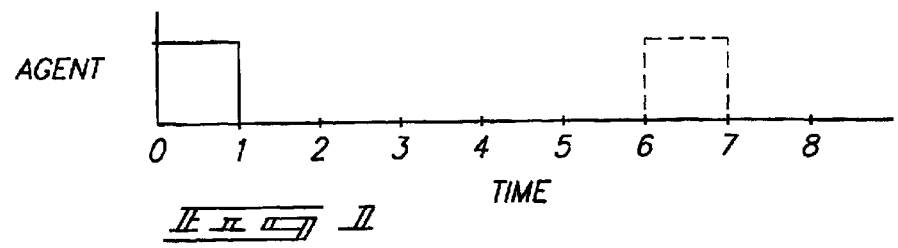
FIGS. 1–4 are line charts respectively showing the timing for contacting a substrate in an atomic layer deposition process with a surface activation agent, precursor 1, precursor 2, and purge gas.
Figure 2:
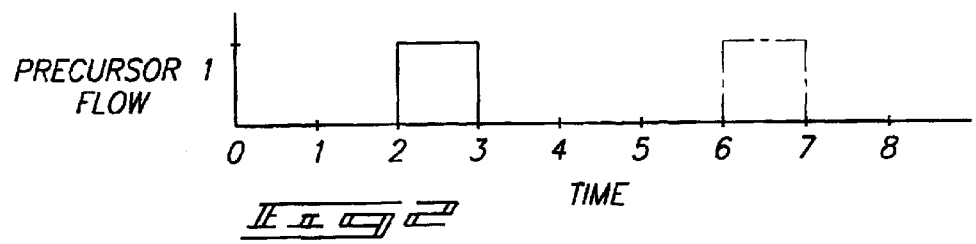
Figure 3:
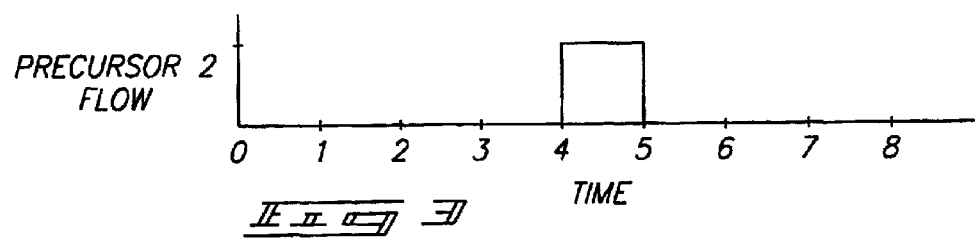
Figure 4:
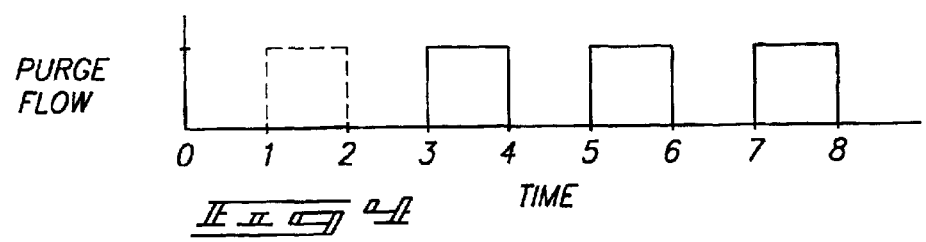

This disclosure of the invention is submitted in furtherance of the constitutional purposes of the U.S. Patent Laws "to promote the progress of science and useful arts" (Article 1, Section 8).

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a contacting species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. A few examples of materials that may be deposited by ALD include silicon nitride, zirconium oxide, tantalum oxide, aluminum oxide, and others.

Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate. Accordingly, observation indicates that chemisorption might not occur appreciably on portions of a substrate though it occurs at a suitable rate on other portions of the same substrate. Such a condition may introduce intolerable defects into a deposited material.

According to one aspect of the invention, a deposition method may include, at a first temperature, contacting a substrate with a surface activation agent and adsorbing a first layer over the substrate. At a second temperature greater than the first temperature, the first layer may be contacted with a first precursor. A second layer may be chemisorbed at least one monolayer thick over the substrate.

Advantageously, the first layer may enhance a chemisorption rate of the first precursor compared to the substrate without the surface activation agent adsorbed thereon. Enhancement of a chemisorption rate of the first precursor may occur in a variety of ways. For example, where chemisorption of the first precursor does not occur uniformly across the substrate, the surface activation agent may provide chemisorption at substantially the same rate, but uniformly across the substrate. Also, a surface activation agent may increase chemisorption rate over regions of a substrate where chemisorption normally would occur, but at a slower rate. The observed effect of either enhancement will be to increase the average chemisorption rate over all of the substrate.

Within the context of this document, "adsorption" refers to surface retention of solid, liquid, or gas molecules, atoms, or ions by a solid or liquid, as opposed to "absorption," the penetration of substances into the bulk of the solid or liquid. Further, in the context of this document, chemisorption refers to a type of adsorption in which chemical bonds are formed between solid, liquid, or gas molecules, atoms, or ions and a solid or liquid surface. The chemical bonds may be weak chemical bonds.

It is a disadvantage of some deposition methods, for example ALD, that nonuniform deposition may occur over regions of a substrate where some difference in surface properties or composition exists in the substrate. By adsorbing a first layer including a surface activation agent over a substrate at a first temperature less than a chemisorption temperature of the surface activation agent on the substrate, more uniform formation of the first layer may be established. The second layer including the first precursor may be chemisorbed on the first layer. Alternatively, the method may include substantially displacing the first layer from over the substrate during the chemisorbing second layer. In such a circumstance, the second layer may be chemisorbed on the substrate. In substantially displacing the surface activation agent, a negligible amount of surface activation agent may remain on which the first precursor may or may not chemisorb. However, substantially displacing the surface activation agent is sufficient to establish a deposited material having the desired properties. Adsorbing the first layer, but not chemisorbing the first layer, may provide a more uniform layer of a surface activation agent than would be established in chemisorption of the same agent or material.

A variety of surface activation means may be utilized, for example, the surface activation agent may be the same as the first precursor or the surface activation agent may be different from any other precursors used in a deposition method. For example, and preferably, the surface activation agent may be a metal halide, a metal organic, an alcohol, a carboxylic acid, or an amine. Also for example, and more preferably, the surface activation agent may be at least one of $TiCl_4$, $WF_6$, hexamethyldisilazane, tetrakis (dimethylamido) titanium, tetraethylorthosilicate, $H_2O$, methanol, ethanol, isopropanol, formic acid, acetic acid, oxalic acid, $NH_3$, methylamine, ethylamine, or dimethylamine. Contacting of the substrate may comprise contacting a bulk semiconductor wafer, or some other material formed over such a wafer, wherein such contacting initiates formation of a new material. Alternatively, contacting a substrate may include contacting a previously chemisorbed layer of a deposition precursor and adsorbing the surface activation agent on the previously chemisorbed layer. That is, adsorbing a surface activation agent may be advantageous both in initiating a deposition method as well as continuing a deposition method after initiation.

A variety of processing conditions may also be suitable according to various aspects of the invention. For example, at a first temperature, when contacting a substrate with a surface activation agent and, at a second temperature, contacting the surface activation agent with a first precursor, the first and second temperatures may be those of at least a portion of the substrate. Also, the first and second temperatures may be those of an outermost surface of the substrate. Still further, the first and second temperatures may be, respectively, those of the surface activation agent and the first precursor. Actual first and second temperatures will depend largely on the individual properties of the surface activation agent and the first precursor as well as a desired deposition material.

Also, chemisorbing the second layer may be accomplished in a variety of ways. The first precursor may consist essentially of a single precursor species. Alternatively, as discussed above, a plurality of species may be used as the first precursor. The second layer chemisorbed from the first precursor may consist essentially of a monolayer. Further, the method may include contacting the second layer with a second precursor and chemisorbing at least one monolayer thick on the second layer. A chemisorption product of the first and second precursors may form a deposition material. The chemisorption product may consist essentially of a monolayer of the deposition material.

As another aspect of the invention, a deposition method may include, at an initial temperature less than a chemisorption temperature of a surface activation agent, adsorbing the agent over a substrate. At a deposition temperature greater than the initial temperature, a first species may be atomic layer deposited over the substrate. Similar surface activation agents to those described above may be used. Such a surface activation agent may enhance an atomic layer deposition rate of the first species compared to the substrate without the surface activation agent adsorbed thereon. The initial and deposition temperatures may be those of at least a portion of the substrate, as well as other substances, such as those described above. The method may further include atomic layer depositing a second species on the atomic layer deposited first species. The deposited first and second species combined may comprise a deposition material.

As a further aspect of the invention, a deposition method may include adsorbing a surface activation agent over a substrate. At least an outer surface of the substrate may be at a first temperature less than a chemisorption temperature of the agent. A temperature of at least a portion of the substrate may then be altered and a monolayer of a first compound may be chemisorbed over the substrate. At least an outer surface of the substrate may be at a second temperature greater than the first temperature. The chemisorption may substantially displace the agent from over the substrate. The method may further include chemisorbing a monolayer of a second compound on the first compound monolayer. As before, the adsorbed surface activation agent may advantageously enhance a chemisorption rate of the first compound compared to the substrate without the surface activation agent adsorbed thereon.

A still further aspect of the invention provides a deposition method that includes contacting a bulk semiconductor wafer with a cooling medium to establish at least an outer surface of the wafer at an initial temperature. The wafer may be contacted with a surface activation agent, adsorbing a first layer on the wafer. The initial temperature may be less than a chemisorption temperature of the agent. The wafer may be placed on a heated wafer chuck and at least an outer surface of the wafer established at a deposition temperature greater than the initial temperature. The first layer may be contacted with a deposition precursor, chemisorbing a second layer at least one monolayer thick over the wafer. In keeping with the previous description, the first layer may enhance a chemisorption rate of the deposition precursor compared to the wafer without the surface activation agent adsorbed thereon. Also, the surface activation agent may be the same as the deposition precursor or, alternatively, different.

Contacting with the cooling medium may be accomplished in a variety of ways. As one example, the wafer may be elevated over the heated wafer chuck and contacted with cooling gases. Placing the wafer on the heated wafer chuck may include lowering the wafer from the position where the wafer was contacted with cooling gases. Also, for example, contacting the wafer with a cooling medium may include placing the wafer on a cooled wafer chuck different from the heated wafer chuck.

Contacting the wafer with a surface activation agent and deposition precursor may also be accomplished in a variety of ways. For example, the wafer may be moved within a single chamber of a deposition apparatus from a first zone containing a surface activation agent to a second zone containing the deposition precursor. The moving may be accomplished by linear translational motion of the heated wafer chuck. Also for example, the wafer may be moved from a cooled wafer chuck in a first chamber of a multiple chamber deposition apparatus to a second chamber of the apparatus wherein contacting with the agent and contacting with the precursor may occur. The moving may be accomplished by a robotic wafer handler.

Accordingly, other aspects of the invention include deposition apparatuses that accomplish surface activation of a substrate. One exemplary deposition apparatus includes a deposition chamber having at least one precursor gas dispenser in each of at least one contacting zone and at least one cooling gas dispenser in each of at least one cooling zone. A substrate chuck moves by linear translational motion from the at least one contacting zone to the at least one cooling zone. The substrate chuck may include a substrate lift that positions a deposition substrate at an elevation above a heated surface of the substrate chuck. Such positioning of a deposition substrate may occur when dispensing a cooling gas in the at least one cooling zone and when dispensing a surface activation agent in the at least one contacting zone.

FIGS. 6 and 7 show a deposition apparatus 2 with a deposition chamber 4 having a contacting zone 20 and a contacting zone 24 as well as a cooling zone 22. Precursor gas dispenser 6 supplies gases 6a and/or 6b to contacting zone 20. Precursor gas dispenser 10 supplies gases 10a and/or 10b to contacting zone 24. Cooling gas dispenser 8 supplies gas 8a to cooling zone 22. Zone boundaries 18 isolate contacting zone 20 from cooling zone 22 and contacting zone 24 from cooling zone 22.

Isolation of zones 20, 22, and 24 within deposition chamber 4 may be accomplished in a variety of ways. As one example, contacting and cooling zones may be established with an inert gas curtain as known to those skilled in the art. Nitrogen, Ar, and He are examples of suitable inert gases. Also, such zones may be established using suitable gas flow conditions as known to those skilled in the art. For example, laminar flow conditions may be suitable. The suitability of particular conditions may be experimentally determined in any manner known to those skilled in the art for a particular deposition chamber and combination of gases and apparatuses inside the chamber that can affect gas mixing. The gas flow conditions may minimize mixing of flowing gases in contacting and cooling zones such that only negligible mixing occurs of supplied gases in a region defined as a zone boundary, for example, zone boundaries 18. Further, the cooling zone may consist essentially of an inert gas curtain isolating two contacting zones. For example, gas 8a may be a cooling gas as well as an inert gas such that no separate inert gas curtain is desired to isolate contacting zone 20 from cooling zone 22 and contacting zone 24 from cooling zone 22.

FIG. 6 also shows a wafer chuck 12 having positioning pins 14 as a substrate lift upon which wafer 16 is placed. Positioning pins 14 position wafer 16 at an elevation above wafer chuck 12. Accordingly, when wafer chuck 12 is heated, wafer 16 will be distanced from a heated surface of wafer chuck 12 for cooling of at least an outer surface of wafer 16 by gas 8a.

As shown in FIG. 7, wafer chuck 12 may move by linear translational motion from cooling zone 22 to contacting zone 20 and positioning pins 14 may lower wafer 16 from the elevation above the heated surface of wafer chuck 12. FIG. 7 shows wafer 16 completely lowered so as to rest on wafer chuck 12, however, an intermediate position between the positions shown in FIGS. 6 and 7 may also be suitable. Gases 6a and/or 6b may be dispensed from precursor gas dispenser 6 with wafer 16 in a lowered position to accomplish chemisorption of a deposition precursor on wafer 16. Although not shown, wafer chuck 12 may also move into contacting zone 24 without lowering positioning pins 14 to accomplish adsorption of a surface activation agent dispensed from precursor gas dispenser 10 at the temperature established in cooling zone 22. Accordingly, substrate chuck 12 may move from one contacting zone through cooling zone 22 to another contacting zone in performing a deposition method such as the various methods described herein. Temperature, contacting of surface activation agents and precursors, chemisorption, and adsorption may be controlled as preferred accordingly to the various aspects of the invention using the apparatus of FIGS. 6 and 7.

Similarly, such methods may also be practiced in a deposition apparatus that includes at least one cooling chamber having a cooled substrate chuck and at least one contacting chamber having at least one precursor gas dispenser. The at least one contacting chamber may also have a heated substrate chuck including a substrate lift that positions a deposition substrate at an elevation above a heated surface of the heated substrate chuck when dispensing a surface activation agent in the contacting chamber. A robotic substrate handler may be provided that moves a substrate from the at least one cooled substrate chuck to the at least one heated substrate chuck. One example of such an apparatus is shown in FIG. 8.

Deposition apparatus 30 of FIG. 8 includes a contacting chamber 40 and a cooling chamber 42. A heated wafer chuck 32 provided in contacting chamber 40 includes positioning pins 34 analogous to positioning pins 14 shown in FIGS. 6 and 7. Positioning pins 34 are shown in FIG. 8 in a raised position. A gas dispenser 38 supplies gases 38a and/or 38b to contacting chamber 40. Cooling chamber 42 includes a cooled wafer chuck 36. Although not shown, a robotic wafer handler moves wafer 16 from cooled wafer chuck 36 to heated wafer chuck 32.

When adsorbing a surface activation agent on wafer 16, positioning pins 34 may operate as a substrate lift to elevate wafer 16 above the heated surface of the substrate chuck. Accordingly, adsorption at a temperature lower than that of heated wafer chuck 32 may be accomplished. Positioning pins 34 may then lower wafer 16 from the elevation above the heated surface to increase temperature and accomplish chemisorption of a deposition precursor in contacting chamber 40. Accordingly, both a surface activation agent and a deposition precursor may be supplied from gas dispenser 38 at appropriate times to accomplish adsorption and chemisorption.

Turning to FIGS. 1–5, a process regime is described for ALD that is within the scope of the present invention. FIGS. 1–4 show the cyclic contacting and purging of a substrate with surface activation agent (SAA), Precursor 1 (P1), and Precursor 2 (P2). As shown in FIG. 1, a substrate is first contacted with SAA from Time 0 (T0) to Time 1 (T1). An optional purge of SAA that is not adsorbed to a substrate may then occur from T1 to T2. Such purge is optional depending on the particular SAA and P1 selected. For example, if SAA and P1 are identical, then it is conceivable that purging might not occur prior to chemisorption of P1. Adsorbed SAA is then contacted with P1 from T2 to T3, chemisorbing P1 over the substrate. As discussed above, P1 may chemisorb either to adsorbed SAA, to the substrate after displacing SAA, or both. After purging excess P1 from T3 to T4, chemisorbed P1 is contacted with P2 from T4 to T5. After purging excess P2 from T5 to T6, the cycle begins again. However, the cycle may begin by either contacting chemisorbed P2 with SAA or P1 from T6 to T7. As also discussed above, it may be desirable only to adsorb SAA as an initial layer or to adsorb SAA at the beginning of more than one cycle of chemisorbing deposition precursors. Accordingly, contacting SAA from T6 to T7 is shown in dashed outline as an optional step and contacting with P1 from T6 to T7 is shown in dash-dot outline also indicating an optional step.

The cycle from T0 to T5 thus may form at least a monolayer of a chemisorption product of P1 and P2. The purge from T5 to T6 prepares the chemisorption product of P1 and P2 to begin a new cycle at T6. Notably, the time intervals from T0 to T1 to T2, etc., are shown as equal merely for graphical convenience. In practice, such times may be individually determined according to the knowledge of those skilled in the art considering the aspects and advantages of the inventions described herein.

Figure 5:
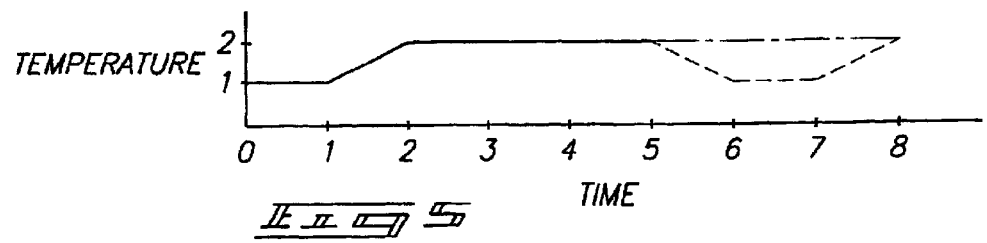
FIG. 5 is a line chart showing the timing for altering temperature during the contacting described in FIGS. 1–4.
Figure 3:
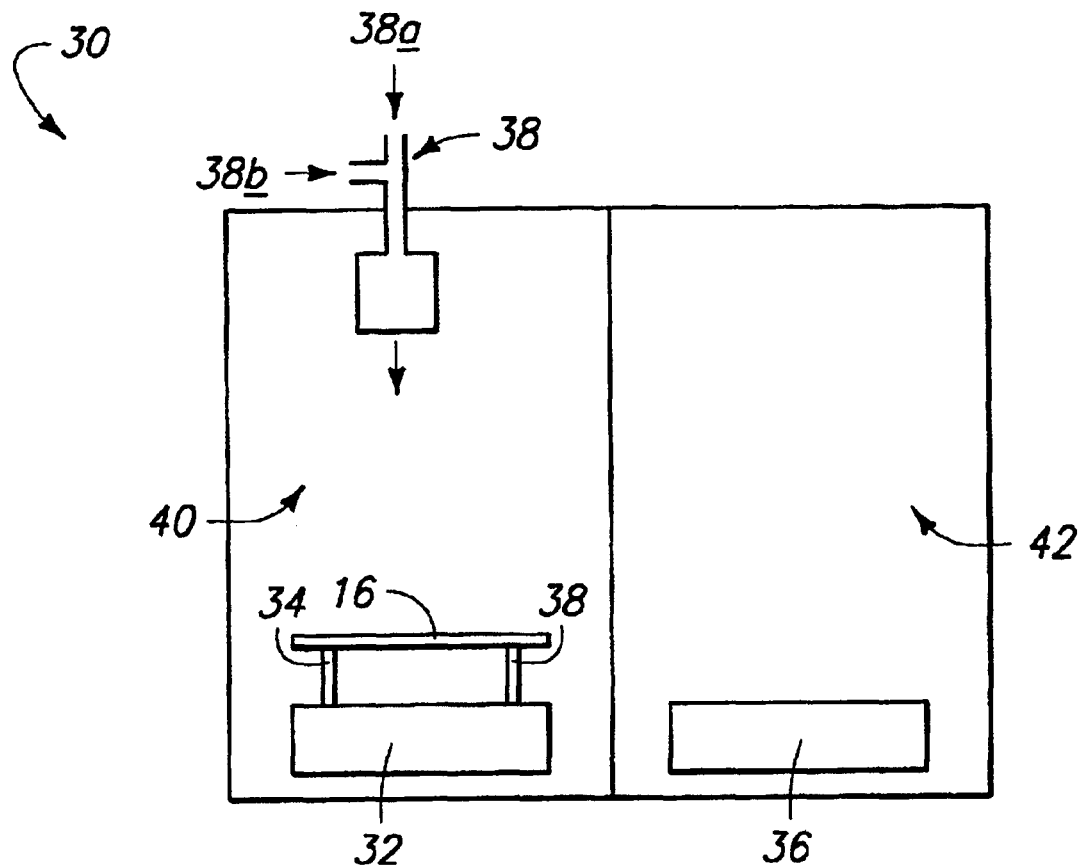

FIG. 5 shows altering the temperature, preferably substrate temperature, as part of the described method. Temperature 1 (Temp1) is maintained from T0 to T1 during contacting of SAA. Thereafter, temperature is increased to Temp2 during purging from T1 to T2 and maintained at Temp2 during contacting of P1, purging, and contacting of P2 from T2 to T5. Depending on whether SAA or P1 will be contacted from T6 to T7, temperature may be reduced from Temp2 to Temp1 from T5 to T6 or may remain at Temp2. Accordingly, temperature remaining at Temp2 from T5 to T7 is shown in dash-dot outline to correspond with contacting P1 and decreasing temperature is shown in dashed outline to correspond with contacting SAA.

In keeping with the various aspects of the invention, other scenarios of contacting surface activating agents and precursors and altering temperatures are also conceivable, some of which are expressly described herein. For example, since temperature changes are involved, it is conceivable that a desired temperature might not be established before starting contacting of a surface activation agent or precursor. Rather, it may be suitable to establish such temperature some time after the start of contacting. Consideration may be made regarding whether the delay in establishing a temperature is justified by an improvement in adsorption or chemisorption efficiency. That is, if a desired temperature for chemisorption is established before contacting, then a difference in chemisorption efficiency might exist compared to not establishing the temperature until after contacting begins. Accordingly, a deposition method according to the various aspects of the invention herein may be optimized for processing time and efficiency depending on the priorities and objectives of a particular process.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A deposition method comprising:
    at a first temperature, contacting a substrate with a surface activation agent and adsorbing a first layer over the substrate, the first temperature being less than a chemisorption temperature of the surface activation agent on the substrate;
    at a second temperature greater than the first temperature, contacting the first layer with a first precursor and chemisorbing a second layer consisting essentially of a monolayer on the first layer, the first layer enhancing a chemisorption rate of the first precursor compared to an otherwise identical substrate without the surface activation agent adsorbed thereon; and
    contacting the second layer with a second precursor, chemisorbing a third layer at least one monolayer thick on the second layer, and forming a chemisorption product of the first and second precursors, the chemisorption product consisting essentially of a monolayer of a deposition material.

2. The deposition method of claim 1 wherein the surface activation agent comprises a metal halide, metal organic, alcohol, carboxylic acid, or amine.

3. The deposition method of claim 1 wherein the surface activation agent comprises at least one of $TiCl_4$, $WF_6$, hexamethyldisilazane, tetrakis(dimethylamido)titanium, tetraethylorthosilicate, $H_2O$, methanol, ethanol, isopropanol, formic acid, acetic acid, oxalic acid, $NH_3$, methylamine, ethylamine, or dimethylamine.

4. The deposition method of claim 1 wherein the first and second temperatures are those of at least a portion of the substrate.

5. The deposition method of claim 1 wherein the first and second temperatures are those of an outermost surface of the substrate.

6. The deposition method of claim 1 wherein the first and second temperatures are respectively those of the surface activation agent and first precursor.

7. The deposition method of claim 1 wherein the substrate comprises a bulk semiconductor wafer.

8. The deposition method of claim 1 wherein the contacting the substrate comprises contacting a previously chemisorbed layer of a deposition precursor and adsorbing the surface activation agent on the previously chemisorbed layer.

9. The deposition method of claim 1 wherein the surface activation agent is the same as the first precursor.

10. The deposition method of claim 1 wherein the first precursor consists essentially of a single precursor species.

11. A deposition method comprising:

at a first temperature, contacting a substrate with a surface activation agent and adsorbing a first layer over the substrate, the first temperature being less than a chemisorption temperature of the surface activation agent on the substrate;

at a second temperature greater than the first temperature, contacting the first layer with a first precursor and chemisorbing a second layer consisting essentially of a monolayer substantially displacing the first layer from over the substrate during the chemisorbing the second layer, the first layer enhancing a chemisorption rate of the first precursor compared to an otherwise identical substrate without the surface activation agent adsorbed thereon; and contacting the second layer with a second precursor, chemisorbing a third layer at least one monolayer thick on the second layer, and forming a chemisorption product of the first and second precursors, the chemisorption product consisting essentially of a monolayer of a deposition material.

12. The deposition method of claim 11 wherein the surface activation agent comprises a metal halide, metal organic, alcohol, carboxylic acid, or amine.

13. The deposition method of claim 11 wherein the surface activation agent comprises at least one of $TiCl_4$, $WF_6$, hexamethyldisilazane, tetrakis(dimethylamido) titanium, tetraethylorthosilicate, $H_2O$, methanol, ethanol, isopropanol, formic acid, acetic acid, oxalic acid, $NH_3$, methylamine, ethylamine, or dimethylamine.

14. The deposition method of claim 11 wherein the surface activation agent is the same as the first compound.

15. The deposition method of claim 11 wherein the contacting with the surface activation agent and first precursor comprises moving the substrate within a single chamber of a deposition apparatus from a first zone containing the surface activation agent to a second zone containing the first precursor.

16. The deposition method of claim 15 wherein the moving is accomplished by linear translational motion of a heated wafer chuck.

17. The deposition method of claim 11 wherein the contacting with the surface activation agent and precursor comprises moving the substrate from a cooled wafer chuck in a first chamber of a multiple chamber deposition apparatus to a second chamber of the apparatus wherein contacting with the agent and contacting with the precursor may occur.

18. The deposition method of claim 17 wherein the moving is accomplished by a robotic wafer handler.

19. The deposition method of claim 11 wherein the substrate comprises a bulk semiconductor wafer.

20. The deposition method of claim 11 wherein the contacting the substrate comprises contacting a previously chemisorbed layer of a deposition precursor and adsorbing the surface activation agent on the previously chemisorbed layer.

21. The deposition method of claim 11 wherein the first precursor consists essentially of a single precursor species.

* * * * *

UNITED STATES PATENT AND TRADEMARK OFFICE
CERTIFICATE OF CORRECTION

PATENT NO.       : 7,094,690 B1
APPLICATION NO.  : 09/652533
DATED            : August 22, 2006
INVENTOR(S)      : Gurtej S. Sandhu et al.

It is certified that error appears in the above-identified patent and that said Letters Patent is hereby corrected as shown below:

Title Page, References Cited, U.S. PATENT DOCUMENTS, please insert:
--4,058,430  11/1977  Suntola et al.--
--5,124,278  06/1992  Bohling et al.--
--5,270,247  12/1993  Sakuma et al.--
--5,290,824  09/2001  Mandal--

Title Page, References Cited, FOREIGN PATENT DOCUMENTS, please insert:
--EP 0 794 568  10/1997--
--Kiyoko et al., Patent Abstract Application No. 04-024917 (JP 9224917, 09/1993), "Semiconductor Substrate and Its Manufacture."--

Page 2, U.S. PATENT DOCUMENTS, please insert:
--5,937,300  08/1999  Sekine et al.--
--6,060,383  05/2000  Nogami et al.--
--6,165,916  12/2000  Muraoka et al.--
--6,258,690  07/2001  Zenke--
--6,620,723  09/2003  Byun et al.--
--6,627,260  09/2003  Derderian et al.--
--6,627,503  09/2003  Ma et al.--
--6,727,169  04/2004  Raaijmakers et al.--
--2002/0066411        06/2002  Chiang et al.--
--2005/0101119 Al  05/2005  Li et al.--
--2005/0124153 Al  06/2005  Cohen--
--2005/0124158 Al  06/2005  Lopatin et al.--
--2005/0124171 Al  06/2005  Vaartstra--

Page 2, OTHER PUBLICATIONS, please insert:
--Vernon, S.M., "Low-cost, high-efficiency solar cells utilizing GaAs-on-Si technology", Dialog Abstract of Report No, NREL/TP-451-5353, 04/1993.--
--Suntola, "Atomic Layer Epitaxy", Handbook of Crystal Growth, Vol. 3, Chapter 14, pages 602-663, 1994.--
--Ritala, et al., "Atomic Layer Epitaxy – A Valuable Tool for Nanotechnolgy?" Nanotechnology, Vol. 10, No. 1, pages 19-24, March 1999.--
--George, et al., "Surface Chemistry for Atomic Layer Growth", Journal of Physical Chemistry, Vol. 100, No. 31, pages 13121-13131, August 1, 1996.--

UNITED STATES PATENT AND TRADEMARK OFFICE
CERTIFICATE OF CORRECTION

PATENT NO. : 7,094,690 B1
APPLICATION NO. : 09/652533
DATED : August 22, 2006
INVENTOR(S) : Gurtej S. Sandhu et al.

It is certified that error appears in the above-identified patent and that said Letters Patent is hereby corrected as shown below:

Column 12, claim 17, line 13
Replace "contacting with the surface activation agent and precursor"
With --contacting with the surface activation agent and first precursor--

Signed and Sealed this

Nineteenth Day of June, 2007

JON W. DUDAS
*Director of the United States Patent and Trademark Office*